United States Patent
Huang et al.

(10) Patent No.: US 10,304,874 B2
(45) Date of Patent: May 28, 2019

(54) FLEXIBLE DISPLAY SUBSTRATE, FLEXIBLE DISPLAY DEVICE, AND METHOD FOR REPAIRING THE SAME

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Weiyun Huang, Beijing (CN); Yuanjie Xu, Beijing (CN); Tingliang Liu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/749,736

(22) PCT Filed: Jun. 30, 2017

(86) PCT No.: PCT/CN2017/091067
§ 371 (c)(1),
(2) Date: Feb. 1, 2018

(87) PCT Pub. No.: WO2018/099064
PCT Pub. Date: Jun. 7, 2018

(65) Prior Publication Data
US 2019/0019818 A1   Jan. 17, 2019

(30) Foreign Application Priority Data
Dec. 2, 2016   (CN) .......................... 2016 1 1111271

(51) Int. Cl.
*H01L 27/12*   (2006.01)
*H01L 21/48*   (2006.01)
(Continued)

(52) U.S. Cl.
CPC .... *H01L 27/1262* (2013.01); *G02F 1/133305* (2013.01); *G02F 1/136259* (2013.01);
(Continued)

(58) Field of Classification Search
CPC ........................ H01L 27/1244; H01L 27/1259
(Continued)

(56) References Cited

U.S. PATENT DOCUMENTS

| 2006/0033130 A1 | 2/2006 | Hashimoto et al. |
| 2008/0254701 A1* | 10/2008 | Koshiishi ............ H01L 27/3276 445/2 |

(Continued)

FOREIGN PATENT DOCUMENTS

| CN | 1605902 A | 4/2005 |
| CN | 1884618 A | 12/2006 |

(Continued)

OTHER PUBLICATIONS

Chinese Search Report, for Chinese Patent Application No. 201611111271.X, dated Apr. 27, 2017, 14 pages.
(Continued)

*Primary Examiner* — David Vu
*Assistant Examiner* — Brandon C Fox
(74) *Attorney, Agent, or Firm* — Kinney & Lange, P.A.

(57) ABSTRACT

A flexible display substrate, a flexible display device, and a method for repairing the same are disclosed in embodiments of the disclosure, all belonging to a technical field of display. The flexible display substrate comprises: an underlying substrate; and a plurality of flexible structure assemblies provided on the underlying substrate, each of which is electrically conductive; at least one of the plurality of flexible structure assemblies comprises at least one repairing layer formed by a first conductive material which is repairable and at least one circuit device layer formed by a second
(Continued)

conductive material, the circuit device layer and the repairing layer being provided to overlap with each other.

19 Claims, 5 Drawing Sheets

(51) Int. Cl.
    *G02F 1/1362*     (2006.01)
    *G02F 1/1333*     (2006.01)

(52) U.S. Cl.
    CPC ........ *H01L 21/486* (2013.01); *H01L 27/1214* (2013.01); *H01L 27/1218* (2013.01); *H01L 27/1259* (2013.01); *G09G 2300/0426* (2013.01); *G09G 2300/0439* (2013.01); *G09G 2330/08* (2013.01)

(58) Field of Classification Search
    USPC ..................................................... 257/59, 72
    See application file for complete search history.

(56) References Cited

U.S. PATENT DOCUMENTS

| 2015/0194343 | A1 | | 7/2015 | Chi et al. | |
|---|---|---|---|---|---|
| 2016/0204060 | A1 | | 7/2016 | Chi et al. | |
| 2017/0062541 | A1 | * | 3/2017 | Ishiyama | ............ H01L 27/3272 |
| 2018/0102396 | A1 | * | 4/2018 | Han | ........................ G09G 3/006 |

FOREIGN PATENT DOCUMENTS

| CN | 101093333 A | | 12/2007 |
|---|---|---|---|
| CN | 104992924 A | * | 10/2015 |
| CN | 104992924 A | | 10/2015 |
| CN | 105425484 A | | 3/2016 |
| CN | 106549021 A | | 3/2017 |

OTHER PUBLICATIONS

International Search Report & Written Opinion, for PCT Patent Application No. PCT/CN2017/091067, dated Sep. 11, 2017, 21 pages.

Third Chinese Office Action, for Chinese Patent Application No. 201611111271.X, dated Jan. 29, 2018, 20 pages.

\* cited by examiner flexible double curved surface display device flexible foldable display device flexible rollable display device

FLEXIBLE DISPLAY SUBSTRATE, FLEXIBLE DISPLAY DEVICE, AND METHOD FOR REPAIRING THE SAME

CROSS-REFERENCE TO RELATED APPLICATION

This application is the national phase of PCT Application No. PCT/CN2017/091067 filed on Jun. 30, 2017, which in turn claims the benefit of Chinese Patent Application Invention No. 201611111271.X filed on Dec. 2, 2016 in the State Intellectual Property Office of China, the whole disclosure of which is incorporated herein by reference.

BACKGROUND OF THE DISCLOSURE

Field of the Disclosure

Embodiments of the present disclosure relate to the technical field of display, and in particular, to a flexible display substrate, a flexible display device, and a method for repairing the same.

Description of the Related Art

A flexible display device refers to a display device provided with a display panel which is deformable by bending, and mainly comprises various types of display device, such as a flexible organic electroluminescent display device, a flexible electrophoretic display device, a flexible liquid crystal display device and the like.

In related technologies of the prior art, an underlying substrate (such as an array substrate and a color filter substrate and the like) in the flexible display device, and flexible structure assemblies which are provided on the underlying substrate and electrically conductive (such as pixel electrodes, common electrodes, thin film transistors and signal wirings) are generally formed by a bendable flexible material. For example, the underlying substrate is generally formed by a plastics substrate or a thin glass sheet. Depending on differences in properties, the flexible structure assemblies also differ from one another in terms of their respective materials. By way of example, an active layer in one thin film transistor is generally formed by an oxide semiconductor (e.g., indium gallium zinc oxide) or an organic semiconductor.

However, an optional range of materials of the flexible structure assemblies is relatively small due to requirements on properties of their own; therefore, the flexible structure assemblies may be typically less flexible than the underlying substrate in the flexible display device, such that the flexible structure assemblies provided on the underlying substrate may tend to be subject to a damage or a failure thereof during a process of deformation of the flexible display device.

SUMMARY OF THE DISCLOSURE

The embodiments of the present disclosure have been made to overcome or alleviate at least one aspect of the above mentioned disadvantages and/or shortcomings in the prior art, e.g., the disadvantage that the flexible structure assemblies in the flexible display device may tend to be subject to a damage or a failure, by providing a flexible display substrate, a flexible display device, and a method for repairing the same.

Following technical solutions are adopted in exemplary embodiments of the invention for achieving the above desired technical purposes.

According to a first aspect of the exemplary embodiment of the present disclosure, there is provided a flexible display substrate, comprising:

an underlying substrate; and a plurality of flexible structure assemblies provided on the underlying substrate, each of which is electrically conductive;

wherein at least one of the plurality of flexible structure assemblies comprises at least one repairing layer formed by a first repairable conductive material which is repairable and at least one circuit device layer formed by a second conductive material, the circuit device layer and the repairing layer being provided to overlap with each other.

According to an embodiment of the disclosure, the at least one repairing layer and the at least one circuit device layer which are provided adjacent to each other are in complete contact and electrical communication with each other.

According to an embodiment of the disclosure, the at least one of the plurality of flexible structure assemblies further comprises one of a gap and an intermediate dielectric layer, located between the at least one repairing layer and the at least one circuit device layer which are provided adjacent to but apart from each other; and the at least one repairing layer and the at least one circuit device layer are in electrical communication with each other.

According to an embodiment of the disclosure, the at least one repairing layer and the at least one circuit device layer are in electrical communication with each other, via at least one of an electrical connector provided within a through-hole which is provided to extend through the intermediate dielectric layer and an electrical connector provided across the gap.

According to an embodiment of the disclosure, each electrical connector comprises at least one of a conductive wire, an electrical contact and a pin.

According to an embodiment of the disclosure, the intermediate dielectric layer is formed by a dielectric material which is repairable.

According to an embodiment of the disclosure, the at least one repairing layer further comprises a first repairing layer and a second repairing layer, and the at least one circuit device layer is provided between the first repairing layer and the second repairing layer.

According to an embodiment of the disclosure, the at least one circuit device layer is formed by a second conductive material which is repairable; and the second conductive material used for the at least one circuit device layer is different from the first conductive material used for the at least one repairing layer.

According to an embodiment of the disclosure, the first conductive material is repairable by at least one of pressurization and heating.

According to an embodiment of the disclosure, the first conductive material comprises at least one of nickel, nickel-titanium alloy, gallium, and conductive gel.

According to an embodiment of the disclosure, the plurality of flexible structure assemblies comprise at least one of pixel electrodes, common electrodes, metal wirings, and gates and sources/drains, and active layers of thin film transistors.

According to an embodiment of the disclosure, the plurality of flexible structure assemblies further comprise the at least one repairing layer provided between and in direct contact with the active layers and the sources/drains.

According to a second aspect of the exemplary embodiment of the present disclosure, there is provided a flexible display device, comprising the flexible display substrate according to the first aspect.

According to a third aspect of the exemplary embodiment of the present disclosure, there is provided a method for repairing the flexible display device according to the second aspect, comprising:

determining a target repairing manner depending on a specific type of the conductive material which is repairable and used to form the flexible structure assemblies within the flexible display device, the target repairing manner comprising at least one of repair by pressurization and repair by heating; and repairing the flexible display device by the target repairing manner.

According to an embodiment of the disclosure, the conductive material which is repairable and used to form the flexible structure assemblies within the flexible display device comprises at least one of nickel, nickel-titanium alloy, gallium, and conductive gel; and determining a target repairing manner depending on a specific type of the conductive material which is repairable and used to form the flexible structure assemblies within the flexible display device comprises:

determining the target repairing manner as the repair by pressurization, in a condition that the conductive material which is repairable is at least one of nickel and conductive gel; and determining the target repairing manner as the repair by heating, in a condition that the conductive material which is repairable is at least one of nickel-titanium alloy and gallium.

According to an embodiment of the disclosure, the target repairing manner is determined as the repair by pressurization in combination with the repair by heating, in a condition that the conductive material which is repairable comprises not only at least one of nickel and conductive gel but also at least one of nickel-titanium alloy and gallium.

According to an embodiment of the disclosure, in a condition that the target repairing manner is determined to comprise at least the repair by pressurization, the method further comprises:

detecting both degree of a crack formed within the repairing layer and a direction in which the crack extends;

determining a magnitude of a pressure applied during the repair by pressurization, depending on the degree of the crack as detected; and determining a direction in which the pressure is applied during the repair by pressurization to be identical to the direction in which the crack extends, depending on the latter direction.

According to an embodiment of the disclosure, in a condition that the target repairing manner is the repair by pressurization, repairing the flexible display device by the target repairing manner comprises applying the pressure on both ends of the flexible display device so as to implement the repair thereof; and in a condition that the target repairing manner is the repair by heating, repairing the flexible display device by the target repairing manner comprises heating a location of the flexible display device at which location a failure occurs so as to implement the repair thereof.

According to an embodiment of the disclosure, heating a location of the flexible display device at which location a failure occurs so as to implement the repair thereof comprises increasing progressively energy of the heating collectively applied on the flexible display device, until the flexible display device displays normally.

According to an embodiment of the disclosure, applying the pressure on both ends of the flexible display device comprises: adjusting persistently the magnitude of the pressure and the direction in which the pressure is applied during the repair by pressurization, until the flexible display device displays normally.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which:

FIG. 4-1 illustrates a structural schematic view of a flexible structure assembly which is conductive, as provided in an embodiment of the disclosure;

FIG. 4-2 illustrates a structural schematic view of another flexible structure assembly which is conductive, as provided in an embodiment of the disclosure;

FIG. 5-1 illustrates a structural schematic view of a flexible curved surface display device as provided in an embodiment of the disclosure;

FIG. 5-2 illustrates a structural schematic view of a flexible double curved surface display device as provided in an embodiment of the disclosure;

FIG. 5-3 illustrates a structural schematic view of a flexible foldable display device as provided in an embodiment of the disclosure;

FIG. 5-4 illustrates a structural schematic view of a flexible rollable display device as provided in an embodiment of the disclosure;

FIG. 5-5 illustrates a structural schematic view of a freely deflectable flexible display device as provided in an embodiment of the disclosure;

DETAILED DESCRIPTION OF PREFERRED EMBODIMENTS OF THE INVENTION

Figure 1:
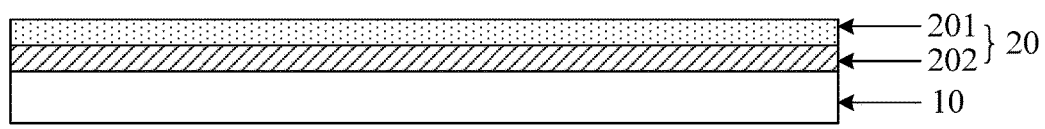
FIG. 1 illustrates a structural schematic view of a flexible display substrate as provided in an embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of the flexible display substrate and the flexible display device.

According to a general technical concept of the present disclosure, there is provided a flexible display substrate; as illustrated in FIG. 1, the flexible display device comprises: an underlying substrate 10; and a plurality of flexible structure assemblies provided on the underlying substrate 10, each of the plurality of flexible structure assemblies being electrically conductive. By way of example, the plurality of flexible structure assemblies comprise at least one of gates (or grid electrodes) and sources/drains and active layers of thin film transistors, and pixel electrodes, common electrodes, metal wirings, and active layers.

At least one flexible structure assembly 20 of the plurality of flexible structure assemblies comprises at least one repairing layer formed by a first conductive material which is repairable, e.g., a single repairing layer 201 as illustrated in FIG. 1. More specifically, as illustrated in FIG. 1, on the underlying substrate 10, there is provided a pixel electrode (or pixel electrodes) or a common electrode (or common electrodes), which functioning as the flexible structure assembly 20 and comprising a layer which is formed by the first conductive material which is repairable, i.e., a repairing layer 201.

It should be noticed that, the first conductive material which is repairable in the embodiments of the disclosure refers to a material which has electrically conductive property and may be repaired in an impaired condition, e.g., by an external force or by heating. The first conductive material which is repairable possess a structural recovery capability, such that any damage or impairment/injury thereof which is caused by long-term mechanical use may be repaired hereby, e.g., by pressurization or by heating. Depending on different properties of each of flexible structure assemblies of the flexible display device, their respective requirements on electrical conductivity of the first conductive material as used which are repairable may vary from one another. Exemplarily, metal wiring(s), pixel electrode(s) and common electrode(s) may all require a repairable conductive material of a relatively strong electrical conducting property to function as the first conductive material, e.g., a metallic repairable material; and as to an active layer in TFT, for example, a semiconductor repairable material may be used to function as the first conductive material, e.g., a metallic oxide repairable material.

In conclusion, a flexible display substrate is provided in an embodiment of the disclosure. Since flexible structure assemblies in the flexible display substrate may for example comprises a repairing layer formed by a first conductive material which is repairable, then during use of the flexible display device, the repairing layer formed by the first conductive material which is repairable may prevent the flexible structure assemblies from being impaired or damaged; or otherwise, once the flexible structure assemblies are subject to impairment or damage, the flexible structure assemblies may repair itself quickly by the first conductive material thereof which is repairable.

By way of example, in an embodiment of the disclosure, each of the plurality of flexible structure assemblies provided on the underlying substrate may comprises at least one repairing layer formed by a first conductive material which is repairable. If each of the flexible structure assemblies is provided therein with the repairing layer, then probability of failure of the flexible structure assemblies within the flexible display device in the embodiments of the disclosure may be decreased significantly as compared with that of common flexible structure assemblies in a conventional flexible display device of the prior art, so as to enhance stability of the flexible display device during operation thereof.

As an alternative implementation of the embodiment of the disclosure, as illustrated in FIG. 1, the at least one flexible structure assembly 20 of the plurality of flexible structure assemblies may for example further comprise at least one circuit device layer 202 formed by a second conductive material, e.g., a single circuit device layer 202 as illustrated in FIG. 1, the circuit device layer 202 and the repairing layer 202 being provided to overlap with each other.

In an exemplary embodiment of the disclosure, by way of example, as illustrated in FIG. 1, the repairing layer 201 and the circuit device layer 202 which are provided adjacent to each other are in complete contact and electrical communication with each other.

In an alternative exemplary embodiment of the disclosure, for example, the at least one of the plurality of flexible structure assemblies further comprises a gap and/or an intermediate dielectric layer, located between the at least one repairing layer and the at least one circuit device layer which are provided adjacent to but apart from each other; and the at least one repairing layer and the at least one circuit device layer are in electrical communication with each other, via an electrical connector (e.g., a conductive wire) provided within a through-hole which is provided to extend through the intermediate dielectric layer, or via an electrical connector (e.g., an electrical contact, and/or a pin) provided across the gap. By way of example, the intermediate dielectric layer is formed by a dielectric material which is repairable, so as to assist in repair. For example, the intermediate dielectric material is formed by boron nitride nano-sheets or nano-flakes which are not electrically conductive but repairable, and thus may resist to repeated multiple-times breakage and repair and still remain its own mechanical strength, electric insulativity (i.e., insulating property) and thermal conductivity simultaneously, so as to provide the flexible structure assemblies with a reliable auxiliary repairing ability.

In an embodiment of the disclosure, for example, as illustrated in FIG. 1, the flexible structure assemblies may comprise a bi-layer structure which is formed by a single repairing layer and a single circuit device layer, and the circuit device layer 202 is for example located at either side of the repairing layer 201. Specifically, as illustrated in FIG. 1, the repairing layer 201 is for example provided above the circuit device layer 202 (i.e., at a side of the circuit device layer 202 away from the underlying substrate 10), without any specific limitation being made on positional relationship between the circuit device layer and the repairing layer in the embodiment of the disclosure. Or otherwise, as an alternative embodiment, the circuit device layer 202 is for example provided immediately above or directly on the repairing layer 201 (i.e., at a side of the repairing layer 201 away from the underlying substrate 10).

Furthermore, the circuit device layer is for example formed by an ordinary electrically conductive material; by way of example, the circuit device layer in pixel electrode(s) or common electrode(s) is formed by Indium-Tin Oxide (i.e., abbreviated as ITO).

Figure 2:
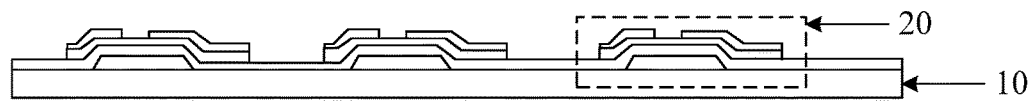
FIG. 2 illustrates a structural schematic view of another flexible display substrate as provided in an embodiment of the disclosure.

As an alternative implementation of an embodiment of the disclosure, the circuit device layer is for example formed by a second conductive material which is repairable and is chosen to be the same as the first conductive which is repairable and used for the repairing layer; and in a further embodiment, in a condition that an identical first conductive material which is repairable is used for both the repairing layer and the circuit device layer, these two layers are formed integrally as a single layer; in other words, the at least one of the plurality of flexible structure assemblies may be formed entirely by the first conductive material which is repairable. That is to say, the flexible structure assembly only comprises a repairing layer formed by the first conductive material which is repairable. Exemplarily, as illustrated in FIG. 2, provided that the flexible structure assembly comprises various circuit device layers (e.g., gate(s), source(s)/drain(s) and active layer(s)) within the TFT 20 provided on the underlying substrate 10, then the various circuit device layers within the TFT 20 are for example formed directly by the first conductive material which is repairable.

By using the first conductive material which is repairable to form directly the flexible structure assemblies within the flexible display device, then a thickness of the flexible display device may be prevented from being increased. Moreover, since the first conductive material which is repairable possesses a repairable property, then it may be repaired by heating or pressurization, so as to improve a repairing efficiency of the flexible structure assemblies once impaired. Besides, in a condition that the first conductive material which is repairable and used in the flexible structure assemblies may be repaired by applying a pressure thereon, then, during use of the flexible display device, with a user bending and/or buckling/flexing the flexible display device progressively, the flexible structure assemblies which are impaired may repair themselves autonomously and automatically so as to decrease the probability of failure of the flexible structure assemblies effectively.

By way of example, in another alternative embodiment of the disclosure, the circuit device layer 202 is for example formed by the second conductive material which is also repairable and different from the first conductive material which is repairable. Since specific repairing ways for different repairable conductive materials may be different, then, in a condition that one impaired or failed flexible structure assembly is formed by two conductive materials which are repairable, then, it may be repaired by using a repairing way specific to any one of the repairable conductive materials, so as to enhance flexibility during the repair of the flexible structure assembly.

Furthermore, in an embodiment of the disclosure, for example, each of the plurality of flexible structure assemblies comprise at least one of pixel electrodes, common electrodes, metal wirings, and gates and sources/drains, and active layers of thin film transistors. In addition, by way of example, each of the plurality of flexible structure assemblies further comprises the at least one repairing layer provided between and in direct contact with the active layers and the sources/drains, so as to assist in specific layout of circuits and to implement the repair in a condition that an effective electrical communication between or among layers is maintained. Additionally or alternatively, each of the plurality of flexible structure assemblies further comprises the at least one of the intermediate dielectric layer and the gap provided between and in direct contact with the active layers and the gates, so as to assist in repair by a repairable non-conductive material between or among layers which are not in direct electrical communication.

Figure 3:
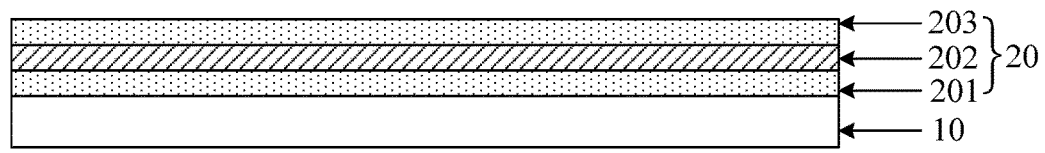
FIG. 3 illustrates a structural schematic view of still another flexible display substrate as provided in an embodiment of the disclosure.
Figures 1, 4:
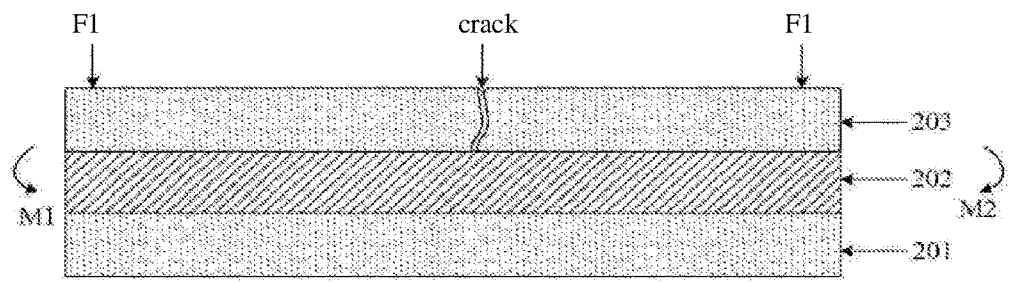
Figures 2, 4:
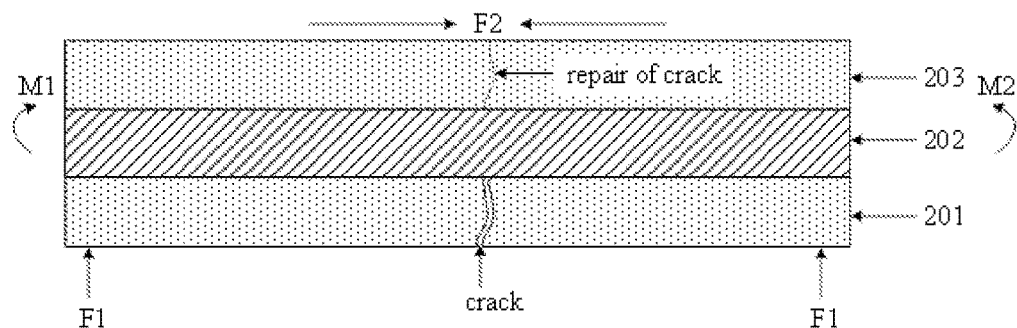

Moreover, as illustrated in FIG. 3, the at least one of the plurality of flexible structure assemblies 20 for example comprises a first repairing layer 201, a circuit device layer 202 and a second repairing device 203 which are provided by overlapping with one another from the underlying substrate 10. The repairing layer 201, 202 each provided respectively on a different side of both sides of the circuit device layer 202 may function to protect the circuit device layer 202 so as to decrease the probability that the circuit device layer 202 is impaired. Exemplarily, as illustrated in FIG. 4-1, provided that the flexible display device is bent and/or buckled/flexed in directions labelled M1 and M2 as illustrated in FIG. 4-1 when the flexible display device is used by a user, then the second repairing device 203 provided on a side of the flexible structure assembly of the flexible display device on which side a tensile stress F1 is applied may generate a crack (or cracks) extending towards the surface of the underlying substrate, with a depth of the crack being related to a degree of bending of the flexible display device as illustrated in FIG. 4-1, i.e., a degree to which the flexible display device is bent to arch and move upwards at a central portion thereof while is bent to move downwards at both end thereof. Once a bending moment applied on the flexible display device is further increased, the crack may extend along an interface between the second repairing layer 203 and the circuit device layer 202 and substantially parallel to the surface of the underlying substrate, without impairing/damaging the circuit device layer 202 which is located centrally between the first repairing layer and the second repairing layer so as to prevent the flexible structure assembly from being subject to a damage or a failure thereof; as such, the flexible structure assembly may operate normally.

Furthermore, in a condition that the flexible display device is bent and/or buckled/flexed in directions labelled M1 and M2 as illustrated in FIG. 4-2 by the user in a subsequent process of use of the flexible display device, then since the second repairing layer 203 of the flexible structure assembly within which layer the crack was originally generated becomes subject to a compressive stress F2, the crack may be repaired autonomously and automatically under the action of the compressive stress F2, by merging opposite side portions of the crack by engagement therebetween. Meanwhile, the first repairing layer 201 may generate another crack at a side thereof on which side a tensile stress F1 is applied, with a depth of such another crack being related to a degree of bending of the flexible display device as illustrated in FIG. 4-2, i.e., a degree to which the flexible display device is bent to project downwards at a central portion thereof while is bent to move upwards at both ends thereof relative to the central portion. Once a bending moment applied on the flexible display device is further increased, such another crack may extend along an interface between the first repairing layer 201 and the circuit device layer 202 and substantially parallel to the surface of the underlying substrate, still without impairing/damaging the circuit device layer 202 which is located centrally between the first repairing layer and the second repairing layer so as to prevent the flexible structure assembly from being subject to a damage or a failure thereof; as such, the flexible structure assembly may operate normally.

By reciprocal bending and flexing as such, it is ensured that the broken repairing layer(s) may be repaired constantly during a normal use of the flexible display device so as to obtain an effect of protecting the circuit device layer.

It should be noted that, in an embodiment of the disclosure, the conductive material which forms the circuit device layer may for example be chosen as one which has a specific resistivity smaller than a preset specific resistivity threshold. In other words, the circuit device layer may be formed by a conductive material having a specific resistivity which is relatively lower than the preset specific resistivity threshold so as to avoid an excessively large voltage drop of a current flowing through the flexible structure assembly and thus to avoid adverse effect on display effects. And the preset specific resistivity threshold is for example set depending on practical conditions, without any delimitation being applied on specific numerical range of such preset specific resistivity threshold in embodiments of the disclosure.

In addition, in embodiments of the disclosure, the first and/or second conductive material which is repairable may for example be at least one of a metal material, a metallic alloy material and a metallic oxide material which may be repaired by at least one of pressurization and heating, e.g., at least one of nickel, nickel-titanium alloy, gallium, and conductive gel. And the conductive gel is for example a conductive high molecular polymer gel material.

Figures 1, 5:
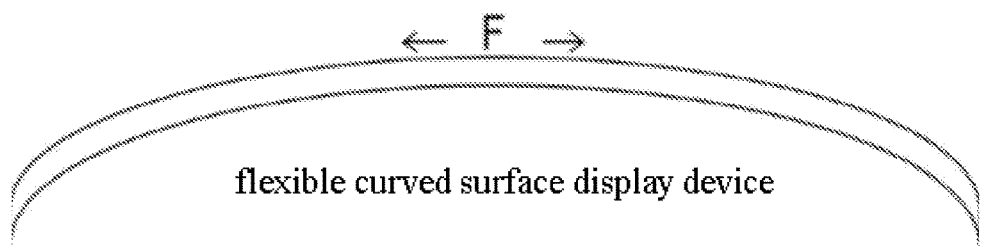
Figures 2, 5:
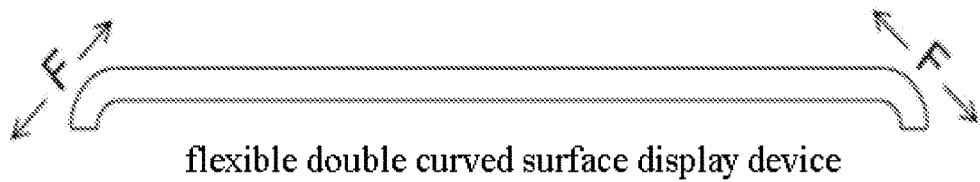
Figures 3, 5:
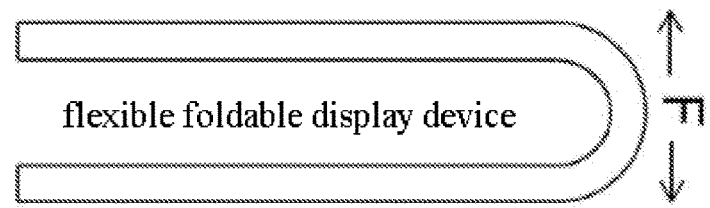
Figures 4, 5:
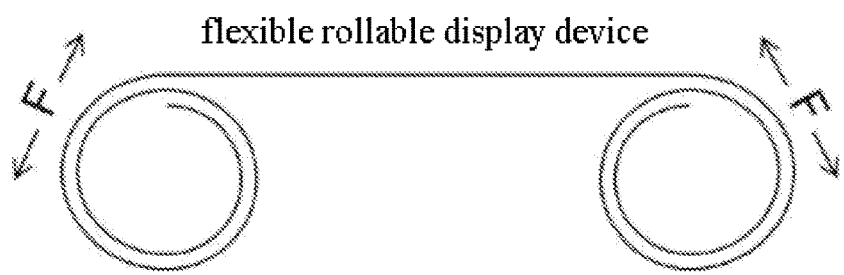
Figure 5:
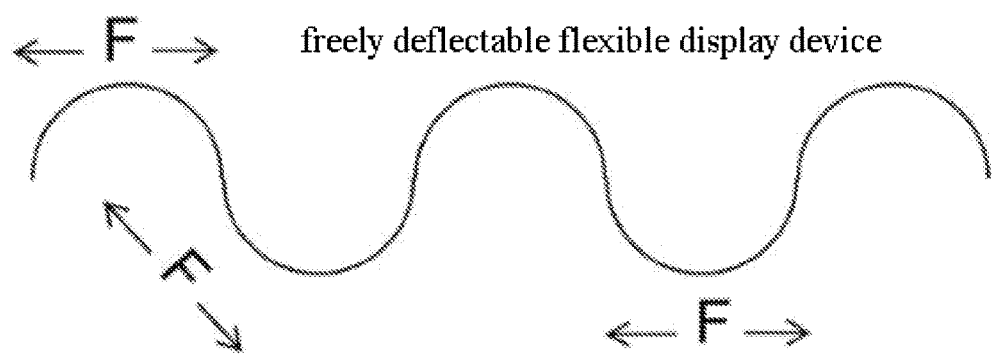

Referring to FIG. 5-1 to FIG. 5-5, a flexible display device is further provided in an embodiment of the disclosure, comprising the flexible display substrate as illustrated in any one of FIGS. 1-3. The flexible display device may for example be: a flexible curved surface display device which is arch-shaped as illustrated in FIG. 5-1, a flexible double curved surface display device which bends and flexes slightly at both ends thereof towards a same side as illustrated in FIG. 5-2, a flexible foldable display device which is foldable relative to a central portion thereof as illustrated in FIG. 5-3, a flexible rollable display device which is rollable from both ends towards a central portion thereof as illustrated in FIG. 5-4, or a freely deflectable flexible display device which is for example in a shape of irregular curved surface as illustrated in FIG. 5-5. As illustrated in FIGS. 5-1 to 5-5, arrows as illustrated refer to directions of acting forces F which is applied onto various flexible display devices during use as illustrated.

Figure 6:
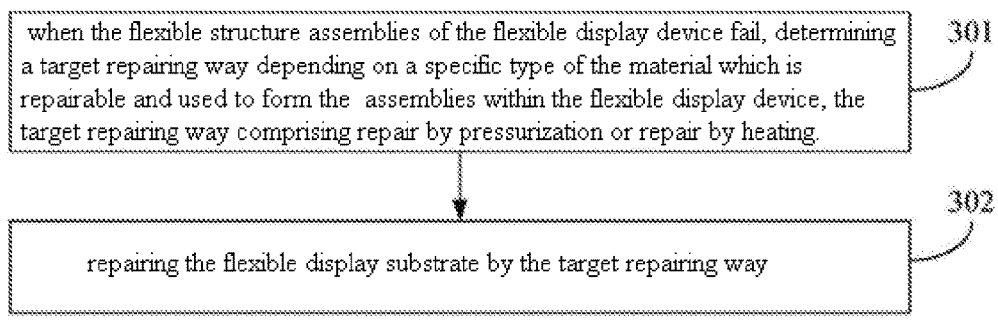
FIG. 6 illustrates a flow chart of a method for repairing the flexible display device as provided in an embodiment of the disclosure.

A method for repairing the flexible display device is further provided in an embodiment of disclosure, for repairing the flexible display device as illustrated in FIGS. 5-1 to 5-5. As illustrated in FIG. 6, the method for example comprises:

Step 301: when the flexible structure assemblies of the flexible display device fail, determining a target repairing way depending on a specific type of the first and/or second conductive material which is repairable and used to form the flexible structure assemblies within the flexible display device, the target repairing way comprising at least one of repair by pressurization and repair by heating.

In an embodiment of the disclosure, since the plurality of flexible structure assemblies are packaged within the flexible display device, then, once the flexible structure assemblies generate crack(s) therein or break completely, such crack or breakage thereof may not be observed directly by visual inspection. And once there occurs cracks or complete breakage in the flexible structure assemblies, a failure in properties thereof may be caused, which may further result in an abnormal display of the flexible display device, e.g., the flexible display device fails to display normally, or there occurs some points on a screen of the display device each of which points has abnormal brightness/luminance. Once such abnormal display of the flexible display device is observed directly by visual inspection of a user, or impairment of the flexible structure assemblies inside the flexible display device is observed indirectly by an auxiliary device such as a microscope and the like, then the target repairing way may be determined, for example depending on the specific type of the first and/or second conductive material which is repairable and used to form the flexible structure assemblies within the flexible display device, or for example depending on an identification on a finished flexible display substrate directly provided marked by a manufacturer thereof, or for example according to a nominal or default target repairing way marked directly in specifications of a manufacturer's instruction. And then, the target repairing way is adopted to repair the flexible display device.

Specifically, in an embodiment of the disclosure, the first and/or second conductive material which is repairable and used to form the flexible structure assemblies within the flexible display device comprises at least one of nickel, nickel-titanium alloy, gallium, and conductive gel and the like. In a condition that the first and/or second conductive material which is repairable and used to form the flexible structure assemblies is at least one of nickel and conductive gel, since both nickel and conductive gel possess a repairable property under an action of a pressure, then the target repairing way is determined as the repair by pressurization. And in a condition that the first and/or second conductive material which is repairable and used to form the flexible structure assemblies is at least one of nickel-titanium alloy and gallium, since nickel-titanium alloy and/or gallium may have a repairable property upon being heated, then the target repairing way is determined as the repair by heating. Moreover, alternatively or additionally, by way of example, in a condition that the first and/or second conductive material which is repairable comprises not only at least one of nickel and conductive gel but also at least one of nickel-titanium alloy and gallium, then the target repairing way is determined as the repair by pressurization in combination with the repair by heating.

Step 302: repairing the flexible display device by the target repairing way.

Figure 7:
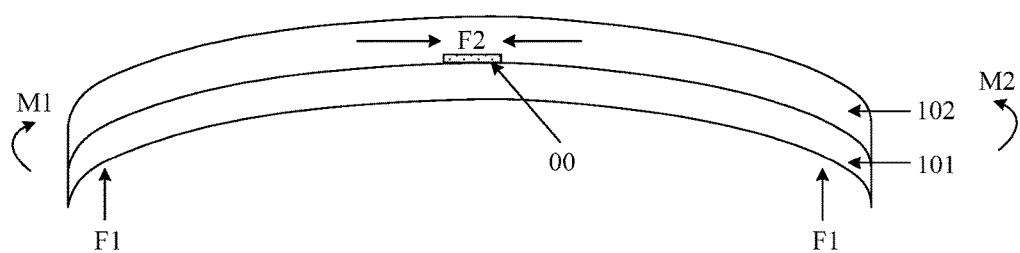
FIG. 7 illustrates a schematic view of a repair by pressurization as provided in an embodiment of the disclosure.

On the one hand, in a condition that the target repairing way is determined as the repair by pressurization, for example, a certain level of pressure is applied on both ends of the flexible display device, so as to repair the flexible display device. Exemplarily, FIG. 7 illustrates a schematic view of a flexible display device as provided in an embodiment of the disclosure. As illustrated, the flexible display device comprises a first underlying substrate 101 (e.g., array substrate) and a second underlying substrate 102 (e.g., color filter substrate), and a flexible structure assembly for example formed between the first underlying substrate 101 and the second underlying substrate 102 in the flexible display device is formed by the first and/or second conductive material each of which is repairable and has the repair by pressurization as its target repairing way. In a condition that the flexible display device has a failure location (i.e., a location at which a failure occurs) labeled "00" on the flexible structure assembly thereof, e.g., the flexible display device may be bent and flexed in directions labeled "M1" and "M2" as illustrated in FIG. 7. Correspondingly, e.g., similar to the operation principle of repair as illustrated in aforementioned FIG. 4-2, the flexible display device become subject to a tensile stress F1 which is generated by a moment M1 at one end thereof and a moment M2 at the other end thereof, while also subject to a compressive stress F2 at the failure location "00" in the flexible structure assembly, e.g., the compressive stress F2 is applied substantially in a direction along a first interface between the flexible structure assembly and the first underlying substrate 101 and a second interface between the flexible structure assembly and the second underlying substrate 102, and substantially tangent to the first interface and/or the second interface, such that a crack generated at the failure location "00" may be repaired autonomously and automatically under the action of the compressive stress F2, by merging opposite side portions of the crack by engagement therebetween. At the same time, though under the action of the tensile stress, a crack or cracks may be generated in a repairing layer located opposite to original failure location "00" in the flexible structure assembly, the circuit device layer in the flexible structure assembly may still remain unimpaired. As such, both a repair at the failure location "00" and a normal operation of the flexible structure assembly may be implemented.

In such a condition, the first conductive material and/or the second conductive material each of which is repairable in impaired flexible structure assembly of the flexible display device may subject to a pressure and then be repaired under the action of such pressure, so as to repair the whole flexible display device.

It should be noted that, during the process of the repair by pressurization, if the crack of the impaired flexible structure assembly inside the flexible display device is observed by an auxiliary device such as a microscope and the like, then a magnitude of a pressure applied during the process of the repair by pressurization is for example adjusted depending on specific level of the crack, and the direction in which the pressure is applied is also adjusted for example depending on the direction in which the crack extends such that the direction in which the pressure is applied is opposite to the direction in which the crack extends. If the crack of the impaired flexible structure assembly may not be observed, then the magnitude of the applied pressure and the direction in which the pressure is applied are adjusted persistently until the flexible display device displays normally, e.g., by increasing an increment of the tensile stress F1 which is sufficiently small, and by implementing an adjustment by an increment of the direction of the tensile stress which adjustment is sufficient small, step by step. The way of repair by pressurization is adapted to the flexible foldable display device which requires bending and flexing repeatedly and the flexible rollable display device which requires rolling repeatedly.

Figure 8:
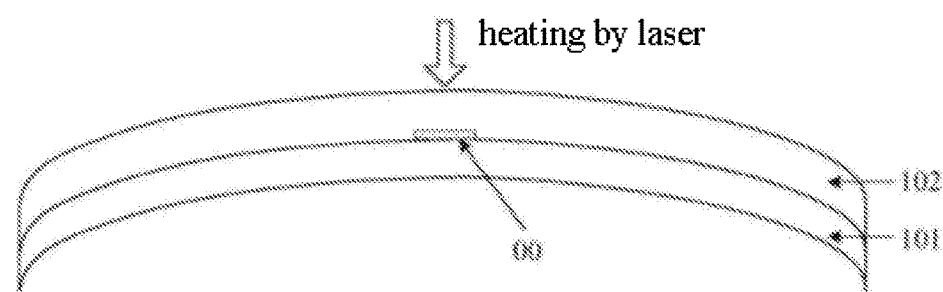
FIG. 8 illustrates a schematic view of a repair by heating as provided in an embodiment of the disclosure.

On the other hand, in a condition that the target repairing way is determined as the repair by heating, FIG. 8 should be referred to, which illustrates a schematic view of another flexible display device as provided in an embodiment of the disclosure. As illustrated, the flexible display device comprises a first underlying substrate 101 (e.g., array substrate) and a second underlying substrate 102 (e.g., color filter substrate), and a flexible structure assembly for example formed between the first underlying substrate 101 and the second underlying substrate 102 in the flexible display device is formed by the first and/or second conductive material each of which is repairable and has the repair by heating as its target repairing way, then, by way of example, a failure location (i.e., a location at which a failure occurs) labeled "00" on the flexible display device may be heated by laser. As such, the first conductive material and/or the second conductive material each of which is repairable in the impaired flexible structure assembly may be partially fused/melt, so as to repair the crack. If the crack of the impaired flexible structure assembly inside the flexible display device is observed by an auxiliary device such as a microscope and the like, then energy of the heating which for example applied by laser may be adjusted depending on specific level of the crack. If the crack of the impaired flexible structure assembly may not be observed, then the magnitude of the energy of the heating applied collectively on the flexible display device, eg., by aforementioned laser or alternatively or additionally by applying steam flow thereon, may be increased persistently, until the flexible display device displays normally, for example by increasing power and/or time of heating by laser in an increment which is sufficient small step by step. The way of repair by heating is adapted to the flexible curved surface display device and the flexible double curved surface display device As an alternative embodiment, a flexible display device is further provided in an embodiment of the disclosure, comprising the flexible structure assembly provided on the underlying substrate, which flexible structure assembly is formed by a first conductive material and/or a second conductive material each of which is repairable and has a repairable property not only in a pressurization condition but also in a heating condition, therefore, the target repairing way of the flexible structure assembly may be an cooperation between the repair by pressurization and the repair by heating. Moreover, depending on different properties of the first conductive material and/or the second conductive material each of which is repairable in the repair by pressurization and in the repair by heating, the heating and the pressurization may be implemented selectively and simultaneously so as to adjust both degree of the heating and the magnitude and direction of the pressurization to obtain an optimized repair as compared with a single repair by pressurization or by heating alone, e.g., to obtain an even faster repairing speed and a better repair effect.

It should also be noted that, in practical use, other heating ways may be used to implement the repair by heating on the failure location of the flexible display device, without any specific delimitation being applied on specific way of heating during the repair by the heating in embodiments of the disclosure.

In conclusion, a method for repairing the flexible display device is provided in embodiments of the disclosure, such that the repair of the flexible display device may be implemented by at least one of pressurization and heating in a condition that the flexible structure assembly in the flexible display device fails. The method for repairing the flexible display device is relative simple and has a relatively high efficiency in repairing.

There are several advantageous technical effects brought about by the technical solutions as provided in embodiments of the disclosure, as below:

A flexible display substrate, a flexible display device, and a method for repairing the same are provided in embodiments of the disclosure, the flexible display substrate comprising: an underlying substrate; and a plurality of flexible structure assemblies provided on the underlying substrate, at least one of the plurality of flexible structure assemblies comprises at least a repairing layer which is formed by a first conductive material and/or a second conductive material which is repairable. Therefore, during a use of the flexible display device, the repairing layer which is formed by the first conductive material and/or the second conductive material which is repairable may prevent the flexible structure assembly from being impaired or damaged; or in a condition that the flexible structure assembly is impaired, it may be repaired quickly by the first conductive material and/or the second conductive material which is repairable.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A flexible display substrate, comprising:
an underlying substrate; and
a plurality of flexible structure assemblies provided on the underlying substrate, each of which is electrically conductive;
wherein at least one of the plurality of flexible structure assemblies comprises at least one repairing layer formed by a first repairable conductive material which is repairable and at least one circuit device layer formed by a second conductive material, the circuit device layer and the repairing layer being provided to overlap with each other; and
wherein the at least one repairing layer and the at least one circuit device layer which are provided adjacent to each other are in complete contact and electrical communication with each other.

2. The flexible display substrate according to claim 1, wherein the at least one of the plurality of flexible structure assemblies further comprises one of a gap and an intermediate dielectric layer, located between the at least one repairing layer and the at least one circuit device layer which are provided adjacent to but apart from each other; and
wherein the at least one repairing layer and the at least one circuit device layer are in electrical communication with each other.

3. The flexible display substrate according to claim 2, wherein the at least one repairing layer and the at least one circuit device layer are in electrical communication with each other, via at least one of an electrical connector provided within a through-hole which is provided to extend through the intermediate dielectric layer and an electrical connector provided across the gap.

4. The flexible display substrate according to claim 3, wherein each electrical connector comprises at least one of a conductive wire, an electrical contact and a pin.

5. The flexible display substrate according to claim 1, wherein the intermediate dielectric layer is formed by a dielectric material which is repairable.

6. The flexible display substrate according to claim 1, wherein the at least one repairing layer further comprises a first repairing layer and a second repairing layer, and
wherein the at least one circuit device layer is provided between the first repairing layer and the second repairing layer.

7. The flexible display substrate according to claim 1, wherein the at least one circuit device layer is formed by a second conductive material which is repairable; and
wherein the second conductive material used for the at least one circuit device layer is different from the first conductive material used for the at least one repairing layer.

8. The flexible display substrate according to claim 1, wherein the first conductive material is repairable by at least one of pressurization and heating.

9. The flexible display substrate according to claim 8, wherein the first repairable conductive material comprises at least one of nickel, nickel-titanium alloy, gallium, and conductive gel.

10. The flexible display substrate according to claim 1, wherein the plurality of flexible structure assemblies comprise at least one of pixel electrodes, common electrodes, metal wirings, gates and sources/drains, and active layers of thin film transistors.

11. The flexible display substrate according to claim 1, wherein the plurality of flexible structure assemblies comprise gates and sources/drains and active layers of thin film transistors, and the at least one repairing layer is provided between and in direct contact with the active layers and the sources/drains.

12. A flexible display device, comprising the flexible display substrate according to claim 1.

13. A method for repairing the flexible display device according to claim 12, comprising:
determining a target repairing manner depending on a specific type of the first conductive material which is repairable and used to form the flexible structure assemblies within the flexible display device, the target repairing manner comprising at least one of repair by pressurization and repair by heating; and
repairing the flexible display device by the target repairing manner.

14. The method according to claim 13, wherein the first conductive material which is repairable and used to form the flexible structure assemblies within the flexible display device comprises at least one of nickel, nickel-titanium alloy, gallium, and conductive gel; and
wherein determining a target repairing manner depending on a specific type of the first conductive material which is repairable and used to form the flexible structure assemblies within the flexible display device comprises:
determining the target repairing manner as the repair by pressurization, in a condition that the first conductive material which is repairable is at least one of nickel and conductive gel; and
determining the target repairing manner as the repair by heating, in a condition that the first conductive material which is repairable is at least one of nickel-titanium alloy and gallium.

15. The method according to claim 14, wherein the target repairing manner is determined as the repair by pressurization in combination with the repair by heating, in a condition that the conductive material which is repairable comprises not only at least one of nickel and conductive gel but also at least one of nickel-titanium alloy and gallium.

16. The method according to claim 13, wherein in a condition that the target repairing manner is determined to comprise at least the repair by pressurization, the method further comprises:
    detecting both degree of a crack formed within the repairing layer and a direction in which the crack extends;
    determining a magnitude of a pressure applied during the repair by pressurization, depending on the degree of the crack as detected; and
    determining a direction in which the pressure is applied during the repair by pressurization to be identical to the direction in which the crack extends, depending on the latter direction.

17. The method according to claim 13, wherein in a condition that the target repairing manner is the repair by pressurization, repairing the flexible display device by the target repairing manner comprises applying the pressure on both ends of the flexible display device so as to implement the repair thereof; and
    wherein in a condition that the target repairing manner is the repair by heating, repairing the flexible display device by the target repairing manner comprises heating a location of the flexible display device at which location a failure occurs so as to implement the repair thereof.

18. The method according to claim 17, wherein heating a location of the flexible display device at which location a failure occurs so as to implement the repair thereof comprises increasing progressively energy of the heating collectively applied on the flexible display device, until the flexible display device displays normally.

19. The method according to claim 17, wherein applying the pressure on both ends of the flexible display device comprises: adjusting persistently the magnitude of the pressure and the direction in which the pressure is applied during the repair by pressurization, until the flexible display device displays normally.

* * * * *